United States Patent
Marcu et al.

(10) Patent No.: US 10,873,335 B2
(45) Date of Patent: Dec. 22, 2020

(54) DIVIDER CONTROL AND RESET FOR PHASE-LOCKED LOOPS

(71) Applicant: Apple Inc., Cupertino, CA (US)

(72) Inventors: Cristian Marcu, San Jose, CA (US); Feng Zhao, San Jose, CA (US); Wei Deng, San Jose, CA (US); Chunwei Chang, San Jose, CA (US); Robert K. Kong, San Francisco, CA (US); Saeed Chehrazi, Irvine, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/401,737

(22) Filed: May 2, 2019

(65) Prior Publication Data

US 2020/0350919 A1    Nov. 5, 2020

(51) Int. Cl.
| | |
|---|---|
| H03L 7/00 | (2006.01) |
| H03L 7/18 | (2006.01) |
| H03L 7/099 | (2006.01) |
| H03L 7/093 | (2006.01) |
| H03L 7/089 | (2006.01) |

(52) U.S. Cl.
CPC .............. H03L 7/18 (2013.01); H03L 7/0891 (2013.01); H03L 7/093 (2013.01); H03L 7/099 (2013.01)

(58) Field of Classification Search
CPC ......... H03L 7/18; H03L 7/0891; H03L 7/093; H03L 7/099
USPC ........................................................ 327/142
See application file for complete search history.

(56) References Cited

U.S. PATENT DOCUMENTS

| | | | |
|---|---|---|---|
| 6,563,387 B2 * | 5/2003 | Hirano | H03L 7/087 327/156 |
| 7,504,894 B2 | 3/2009 | Kawamoto et al. | |
| 7,511,579 B2 * | 3/2009 | Wang | H03L 7/113 327/156 |
| 9,240,794 B2 * | 1/2016 | Reichelt | H03L 7/0802 |
| 9,240,795 B2 * | 1/2016 | Reichelt | H03L 7/18 |
| 2009/0042528 A1 * | 2/2009 | Pellerano | H03L 7/193 455/260 |
| 2013/0141146 A1 * | 6/2013 | Shima | H03L 7/08 327/157 |
| 2014/0327477 A1 * | 11/2014 | Chiang | H03L 7/08 327/156 |
| 2015/0349992 A1 * | 12/2015 | Gao | H04B 1/16 375/376 |
| 2016/0036453 A1 * | 2/2016 | Frank | H03L 7/085 327/156 |
| 2016/0036485 A1 * | 2/2016 | Nagaso | H03L 7/099 455/76 |

(Continued)

FOREIGN PATENT DOCUMENTS

WO       2004100380       11/2004

*Primary Examiner* — Ryan Jager
(74) *Attorney, Agent, or Firm* — Kowert, Hood, Munyon, Rankin & Goetzel, P.C.

(57) ABSTRACT

In a computer system, a phase-locked loop circuit may generate a clock signal using a reference signal. The phase-locked loop circuit may include a programmable divider stage that includes multiple divider stages. When a frequency calibration is initiated on the phase-locked loop circuit, a control circuit may generate a pause signal in response to one or more of the divider stages reaching a particular logic state. The programmable divider stage may hold the one or more of the divider stages in the particular logic state using the pause signal.

16 Claims, 10 Drawing Sheets

(56) References Cited

U.S. PATENT DOCUMENTS

2017/0264333 A1  9/2017  Hoshino

* cited by examiner

DIVIDER CONTROL AND RESET FOR PHASE-LOCKED LOOPS

BACKGROUND

Technical Field

This disclosure relates to power management in computer systems and more particularly to clock generator circuit operation.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate using different clock signals, which provide a timing reference for various sub-circuits within the circuit blocks. For example, in some circuit blocks, a clock signal may be used to trigger the transition of a flip-flop circuit from one state to another. Alternatively, a clock signal may be used to activate a latch circuit in order to capture a data state of signal.

Various circuits may be used to generate the various clock signals used in an integrated circuit. For example, a crystal oscillator may be used to generate a reference clock signal. Additional clocks signals of various frequencies may be generated using phase-locked loop circuits, delay-locked loop circuits, and the like. Circuits like phase-locked loop circuit may employ oscillator circuit whose frequency can be adjust by changing a level of a control current or voltage.

SUMMARY OF THE EMBODIMENTS

Various embodiments for a clock generator circuit are disclosed. Broadly speaking, a phase-locked loop circuit is configured to generate a clock signal using a reference signal. The phase-locked loop circuit may include a programmable divider circuit that includes a plurality of divider stages. In response to an initiation of a frequency calibration operation being performed on the phase-locked loop circuit, a control circuit may be configured to generate a pause signal, in response to a determination that one or more of the plurality of divider stages have reached a particular logic state during the frequency calibration operation. The programmable divider circuit may be configured to hold, using the pause signal, the particular logic state of the one or more of the plurality of divider stages. In other embodiments, the phase-locked loop circuit may further include an oscillator circuit, a phase detector circuit, a charge pump circuit, and filter circuit. In response to the initiation of the frequency calibration operation, the control circuit may be further configured to disable the phase detector circuit, the charge pump circuit, and the filter circuit.

Figure 1:
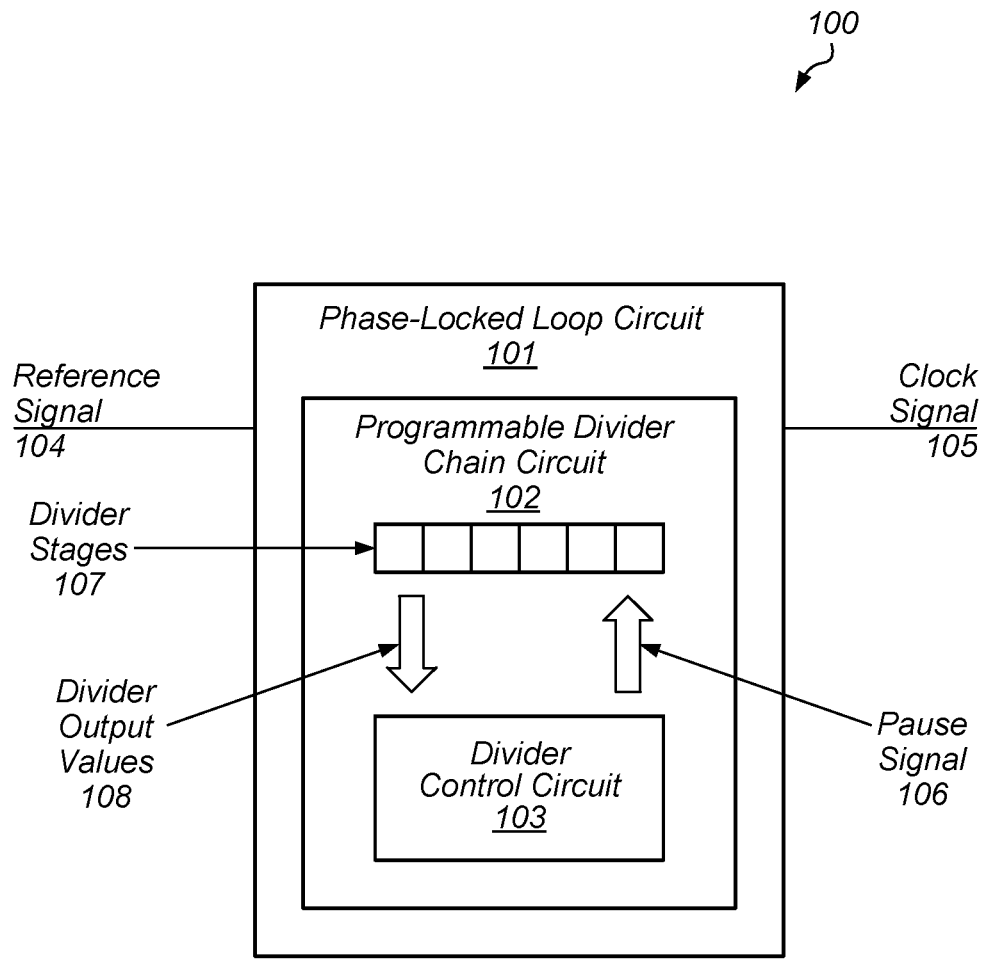
FIG. 1 is a block diagram of an embodiment of a phase-locked loop circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodi-

DETAILED DESCRIPTION OF EMBODIMENTS

Computer systems may include multiple circuit blocks configured to perform specific functions. Such circuit blocks may be fabricated on a common substrate and may operate at different frequencies. To allow for different frequencies of operation, a computer system may employ different clock signals, which provide a time reference for circuits within the circuit blocks. Computer systems may include multiple clock generation subsystems to generate the different clock signals. Such clock generation subsystems may include phase-locked loop (PLLs), delay-locked loops (DLL), or other suitable circuits configured to generate a periodic signal suitable for use as a clock signal.

Phase-locked loop circuits typically include an oscillator circuit configured to generate a clock signal whose frequency is based on a control signal generated based on a phase difference between the clock signal and a reference signal. By adjusting the control signal, any phase difference between the clock signal, or frequency-divided version of the clock signal, to the reference signal may be reduced to desired levels. The control signal may be adjusted until the phase-locked loop is locked. As used herein, a phase-locked loop is considered locked when the phase difference between the clock signal (or frequency-divided version of the clock signal) and a reference signal is less than a threshold value.

During operation of a clock generator subsystem, periodic frequency calibration operations may be performed. Such frequency calibration operations may be in response to a change in a target frequency of an output clock signal, a reset of the clock generator subsystem, and the like. As described below in more detail, when a frequency calibration operation is performed, coarse adjustments may be made to an oscillator circuit included within the clock generator subsystem in order to set a frequency of an output of the oscillator circuit to a value at or near a target frequency.

Frequency calibration operations can pose difficulties for phase-locked loop circuits that employ a frequency divider circuit. While the oscillator circuit is being adjusted during a frequency calibration operation, the frequency divider circuit may continue to operate generating a divided frequency signal. As the frequency of the oscillator circuit is adjusted, the frequency of the divided frequency signal will also change and the signal from the oscillator triggers transitions through the frequency divider circuit.

When the frequency calibration ends, the transitions resulting from the most recent frequency change of the oscillator circuit may still be propagating through the frequency divider circuit. As a result, the phase difference between the frequency divided signal and a reference signal may be large, which may increase the time the phase-locked loops needs to lock. Such increases in the lock time may result in additional power consumption as well as added latency before the clock signal generated by the phase-locked loop is ready for use. The embodiments illustrated in the drawings and described below may provide techniques for operating a phase-locked loop with a frequency divider circuit to reduce a phase difference between the frequency divided signal and the reference signal during frequency calibration, thereby reducing lock time of the phase-locked loop circuit reducing power consumption and latency.

A block diagram depicting an embodiment of a phase-locked loop circuit is illustrated in FIG. 1. As illustrated, phase-locked loop circuit 100 includes programmable divider chain circuit 102, which includes divider control circuit 103. Phase-locked loop circuit 100 is configured to generate clock signal 105 using reference signal 104.

In various embodiments, divider stages 107 are configured to generate respective ones of divider output values 108. As described below in more detail, a frequency divisor associated with a given one of divider stages 107 may be changed using a selection signal. For example, in some cases, the given one of divider stages 107 may be set to divide a frequency of a input signal by either 2 or 3 in order to generate an output signal.

As mentioned above, frequency calibration operations may be performed on phase-locked loop circuit 100. During such frequency calibration operations, coarse adjustments are made to the frequency of an oscillator circuit included in phase-locked loop circuit 100. Divider control circuit 103 is configured, in response to an initiation of a frequency calibration operation being performed on phase-locked loop circuit 101, to generate pause signal 106, in response to a determination that one or more of divider output values 108 have reached a particular logic state during the frequency calibration operation. As used herein, a logic state refers to collection of particular output values of any suitable combination of logic circuits or gates.

Programmable divider chain circuit 102 is further configured to halt, using the pause signal, the operation of one or more of divider stages 107 to maintain the particular logic state of the one or more of divider output values 108. By halting the operation of the one or more of divider stages 107, programmable divider chain circuit 102 is held in a particular state during the remainder of the frequency calibration. The particular state may be selected to minimize a phase difference between an output of programmable divider chain circuit 102 and reference signal 104, once the frequency calibration operation concludes. By minimizing the phase difference, the time required for phase-locked loop circuit 101 to lock may be reduced, thereby reducing power consumption during the lock phase of operation and improving overall system performance by reducing latency to a valid clock signal.

Figure 2:
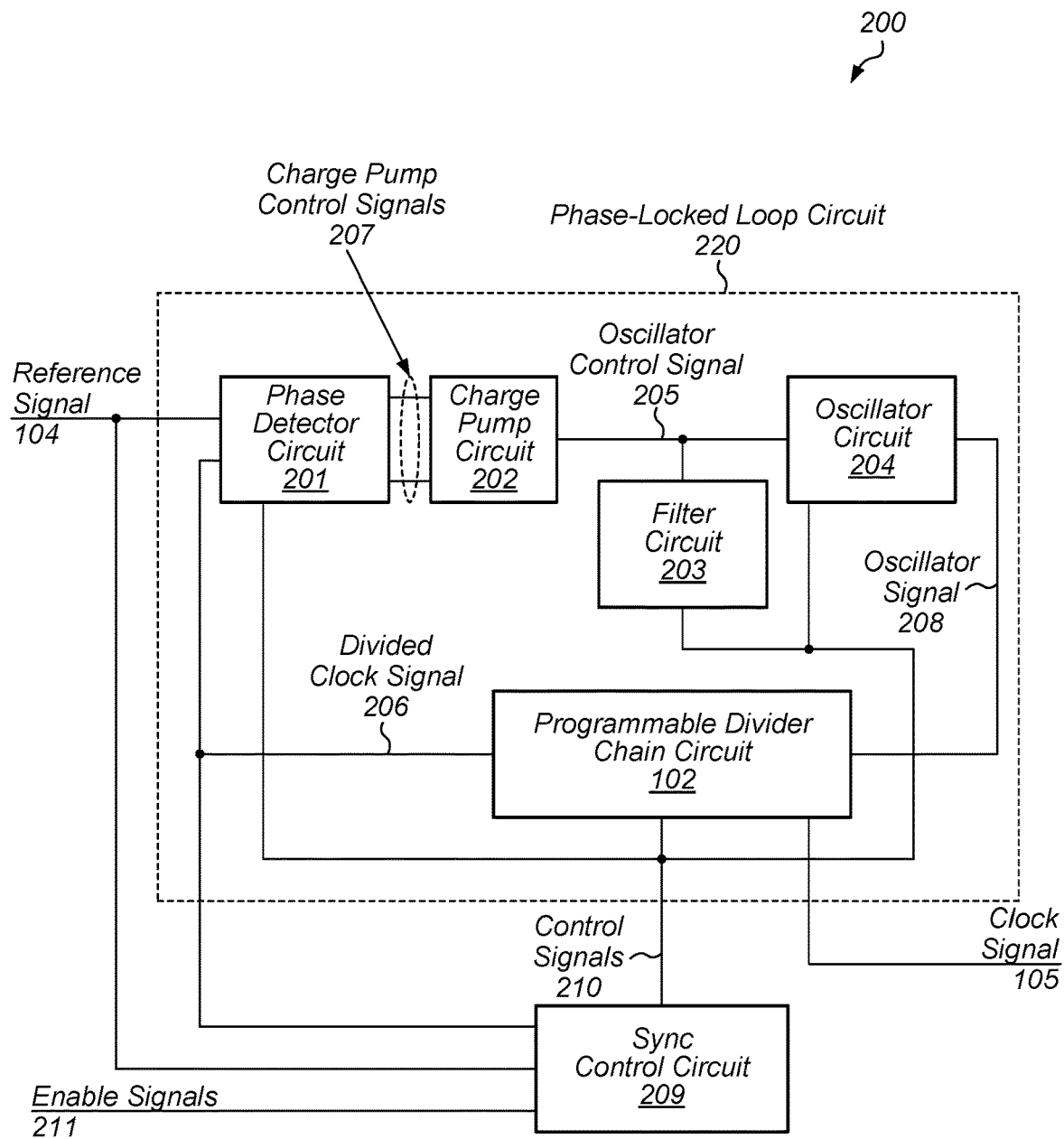
FIG. 2 illustrates a block diagram of an embodiment of a clock generator subsystem including a phase-locked loop circuit.

Turning to FIG. 2, a block diagram illustrating an embodiment of a clock generator subsystem is depicted. As illustrated, clock generator subsystem 200 includes phase-locked loop circuit 220 and sync control circuit 209. In various embodiments, phase-locked loop circuit 220 may correspond to phase-locked loop circuit 100 as depicted in FIG. 1.

Phase-locked loop circuit 220 includes phase detector circuit 201, charge pump circuit 202, filter circuit 203, oscillator circuit and programmable divider chain circuit 102.

Phase detector circuit 201 is configured to detect a phase difference (also referred to as a "phase angle") between reference signal 104 and divided clock signal 206. As used and described herein, a phase difference refers to a time difference between two signals of similar frequency. Based on the phase difference between reference signal 104 and divided clock signal 206, phase detector circuit 201 is configured to activate charge pump control signals 207. For example, if reference signal 104 leads divided clock signal 206, then phase detector circuit 201 may activate a particular one of charge pump control signals 207 to indicate to charge pump circuit 202 to add charge to oscillator control signal 205. In some cases, each of charge pump control signals 207 may include a series of pulses that instruct charge pump circuit 202 to incrementally increase or decrease a voltage level of oscillator control signal 205.

Phase detector circuit 201 may be designed according to one of various design styles. In some embodiments, phase detector circuit 201 may be a phase detector circuit configured to detect phase differences that are less than a single cycle, while in other embodiments, phase detector circuit 201 may be a phase-frequency detector that is capable of detecting phase differences even if such phase differences are greater than a single cycle. Phase detector circuit 201 may include any suitable combination of analog frequency mixing circuits, analog multiplier circuits, and digital logic gates.

Charge pump circuit 202 is configured to, using charge pump control signals 207, add or subtract charge from a signal line associated with oscillator control signal 205. In various embodiments, charge pump circuit 202 may include current source circuits and current sink circuits, which are activated for respective periods of time to source current to, or sink current from oscillator the signal line associated with oscillator control signal 205, thereby changing the voltage level of oscillator control signal 205.

Filter circuit 203 is configured to attenuate frequency components of oscillator control signal 205 above a certain threshold frequency (referred to as a "cutoff frequency"). By filtering the frequency components of oscillator control signal 205 that are above the cutoff frequency, the voltage level of oscillator control signal 205 may be more stable resulting in less jitter in both oscillator signal 208 and clock signal 105.

In various embodiments, filter circuit 203 may include any suitable combination of resistors, capacitors, and other passive or active circuit elements configured to attenuate frequencies above the cutoff frequency. In some cases, filter circuit 203 may additionally includes amplifier or other gain circuits.

Oscillator circuit 204 is configured to generate oscillator signal 208 such that the frequency of oscillator signal 208 is based on the voltage level of oscillator control signal 205. In various embodiments, oscillator circuit 204 may be a particular example of a voltage-controlled oscillator circuit. Oscillator circuit 204 may, in other embodiments, include multiple gain stages coupled together in a daisy chain fashion to form a ring.

As described above, programmable divider chain circuit 102 is configured to generate divided clock signal 206 and clock signal 105 using oscillator signal 208, such that a frequency of divided clock signal 206 is a quotient of a frequency of oscillator signal 208 and a selected divisor. A frequency of clock signal 15 may also be a quotient of the frequency of oscillator signal 208 and a different selected divisor. As described below in more detail, programmable divider chain circuit 102 may include multiple divider stages and associated control circuits to perform the frequency division as well as detection of a particular logic states of one or more of the divider stages upon completion of a frequency calibration operation.

Each of phase detector circuit 201, charge pump circuit 202, and filter circuit 203 and enabled and disabled by corresponding ones of control signals 210, generated by sync control circuit 209 using enable signals 211, reference signal 104, and divided clock signal 206. As described below in more detail, sync control circuit 209 may re-time enable signals 211 to generate control signals 210. As used herein, re-timing a signal references to changing a phase difference between the signal and a time based used within a computer system. For example, re-timing a signal may include delaying a signal relative to a clock signal, wherein the delay is determined by other signals within the computer system.

In various embodiments, phase detector circuit 201, charge pump circuit 202, and filter circuit 203 may be disabled or decoupled from one another during a frequency calibration operation. During the frequency calibration operation, a particular one of control signals 210 may iteratively adjust oscillator circuit 204 so that the frequency of clock signal 105 is close to a target frequency. Upon completion of the of the frequency calibration operation, enable signals 211 may be used to re-enable and/or re-couple phase detector circuit 201, charge pump circuit 202, and filter circuit 203, once a particular phase relationship between reference signal 104 and divided clock signal 206 has been achieved, in a process referred to as "phase resetting." By disabling phase detector circuit 201, charge pump circuit 202, and filter circuit 203 during frequency calibration and delaying re-enabling the circuit until the particular phase relationship has been detected, a time for phase-locked loop circuit 101 to lock to the target frequency may be minimized by eliminating undesired pulses on divided clock signal 206.

Figure 3:
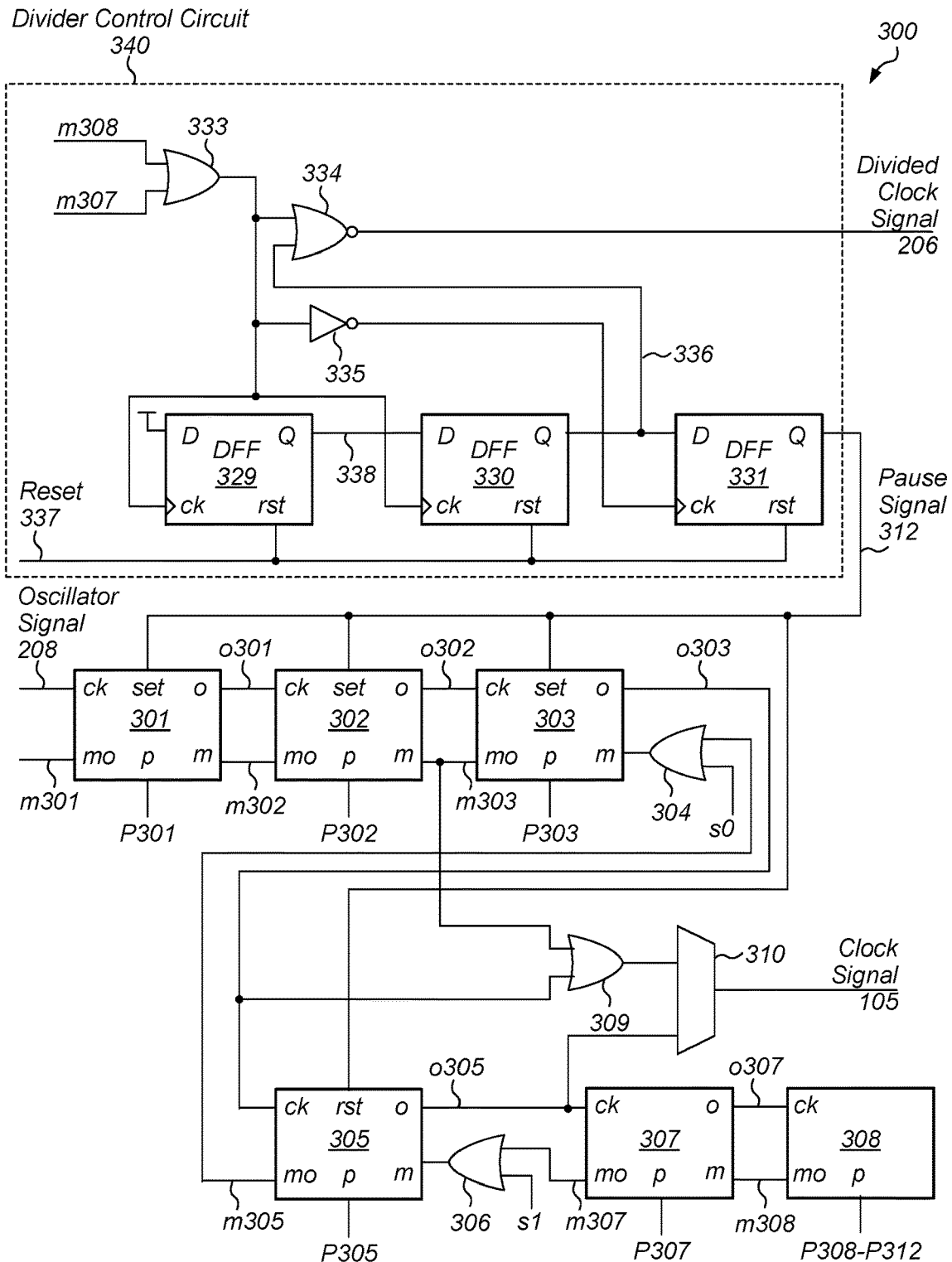
FIG. 3 illustrates a block diagram of an embodiment of a programmable divider circuit.

A block diagram depicting an embodiment of programmable divider chain is illustrated in FIG. 3. In various embodiments, programmable divider chain 300 may correspond to programmable divider chain 102 as depicted in FIG. 1. As illustrated, programmable divider chain 300 includes divider stages 301-303, 305 and 307, counter circuit 308, OR gates 304, 306, and 309, multiplex circuit 310, and divider control circuit 340.

The ck input of divider stage 301 is coupled to oscillator signal 208, and the o output of divider stage 301 is coupled the ck input of divider stage 302 via node o311. The m input of divider stage 301 is coupled to the mo output of divider stage 302 via node m302. The mo output of divider stage 301 is coupled to node m301. In a similar fashion, the ck input of divider stage 302 is coupled to node o301, and the o output of divider stage 302 is coupled to the ck input of divider stage 303 via node o302. The m input of divider stage 302 is coupled to the mo output of divider stage 303 via node m303, and the mo output of divider stage 302 is coupled to node m302.

The m input of divider stage 303 is coupled to an output of OR gate 304, whose inputs are coupled to s0 and the mo output of divider stage 305 via node m305. The ck input of divider stage 305 is coupled to the o output of divider stage 303 via node o303, and the o output of divider stage 305 is coupled to the ck input of divider stage 307 via node o305. Them input of divider stage 305 is coupled to the output of OR gate 306, whose inputs are coupled to s1 and the mo output of divider stage 307. The mo output of divider stage 305 is coupled to an input of OR gate 304 via node m305.

The ck input of divider stage 307 is coupled to the o output of divider stage 305 via node o305, and the o output of divider stage 307 is coupled to the ck input of counter circuit 308 via node o307. The mo output of divider stage 307 is coupled to an input of OR gate 306 via node m307. The m input of divider stage 307 is coupled to the mo output of counter circuit 308 via node m308.

Counter circuit 308 may be a particular embodiment of a sequential logic circuit configured to generate a value on node m4308 using transitions on node o307. In some cases, the value of counter circuit 308 may be preset using values P308-P312, or the values of P308-P312 may be used to change a counting pattern of counter circuit 308.

Each of signals P301-307 is used to adjust a frequency divisor of the divider stages 301-303, 305, and 307. In various embodiments, each of divider stages 301-303, 305, and 307 can be configured to divide the frequency of its input signal by either 2 or 3 to generate its output signals. By setting different combinations of divider stages 301-303, 305, and 307 to different values, along with control bits s0 and s1, the frequency of oscillator signal 208 may be divided by any suitable integer in order to generate divided clock signal 206. For example, setting s0 to a logical-0 and s1 to a logical 1, along with setting p301-p303, p305, and p307 such that the correspond to binary value of 5, may set the frequency divisor for clock signal 105 to 13.

It is noted that OR gates 304, 306, and 308 may be particular embodiments of complementary metal-oxide semiconductor (CMOS) logic gates configured to perform a logical-OR operation on its input signals to generate its output signal.

Respective inputs of OR gate 309 are coupled to the mo output of divider stage 303 via node m303, and the o output of divider stage 303 via node o303. The output of OR gate 309 is coupled to a first input of multiplex circuit 310. A second input of multiplex circuit 310 is coupled to the o output divider stage 305 via node o305, and the output of multiplex circuit is coupled to clock signal 105.

In various embodiments, divider control circuit 340 may correspond to divider control circuit 103. As illustrated, divider control circuit 340 includes DFFs 329-331, inverter 335, OR gate 333, and NOR gate 334. It is noted that DFFs 329-331 may be particular embodiments of data flip-flop circuits, and inverter 335 may be a particular embodiment of complementary metal-oxide semiconductor (CMOS) inverting amplifiers. It is also noted that OR gate 333 may be a particular embodiment of a CMOS logic gate configured to perform a logical-OR on its input signals to generate an output signal, and NOR gate 334 may be a particular embodiment of a CMOS logic gate configured to perform a logical-not-OR (or logical-NOR) on its input signals to generate an output.

The D input of DFF 329 is coupled to a power supply signal, and its Q output (node 338) is coupled to the D input of DFF 330. The ck input of DFF 329 is coupled to the output of OR gate 333. The Q output of DFF 330 is coupled to the D input of DFF 409 and an input of NOR gate 334 via node 336. The ck input of DFF 330 is also coupled to the output of OR gate 333. The Q output of DFF 331 is coupled to pause 312, which is, in turn, coupled to the set inputs of divider stages 301-305. The rst inputs of DFFs 329-331 are coupled to reset 337.

The inputs of OR gate 333 are coupled to nodes m308 and m309, and the output of OR gate 333 is coupled to a first input of NOR gate 334 and an input of inverter 335. The output of inverter 335 is coupled to the ck input of DFF 331. A second input of NOR gate 334 is coupled to the Q output of DFF 330, and the of NOR gate 334 is coupled to divided clock signal 206.

During a frequency calibration operation, reset 337 is set low allowing DFFs 329-331 to become active. Transitions of oscillator signal 208 toggle divider stage 301, which, in turn, toggle divider stage 302, and so forth. Once the state of nodes m308 and m307 transition from low to high, DFFs 407 and 408 are clocked. When signal m406 transitions back low, DFF 331 is clocked, generating pause 312. When pause 312 is asserted, divider stages 301-303, and 305 are held in their set states, preventing further transitions on oscillator signal 208 from triggering transitions within the divider stages 301-305. By halting the divider stages in this fashion, divided clock signal 206 and reference signal 104 may be aligned upon completion of the frequency calibration operation, thereby reducing a time for phase-locked loop circuit 100 to lock.

Figure 4:
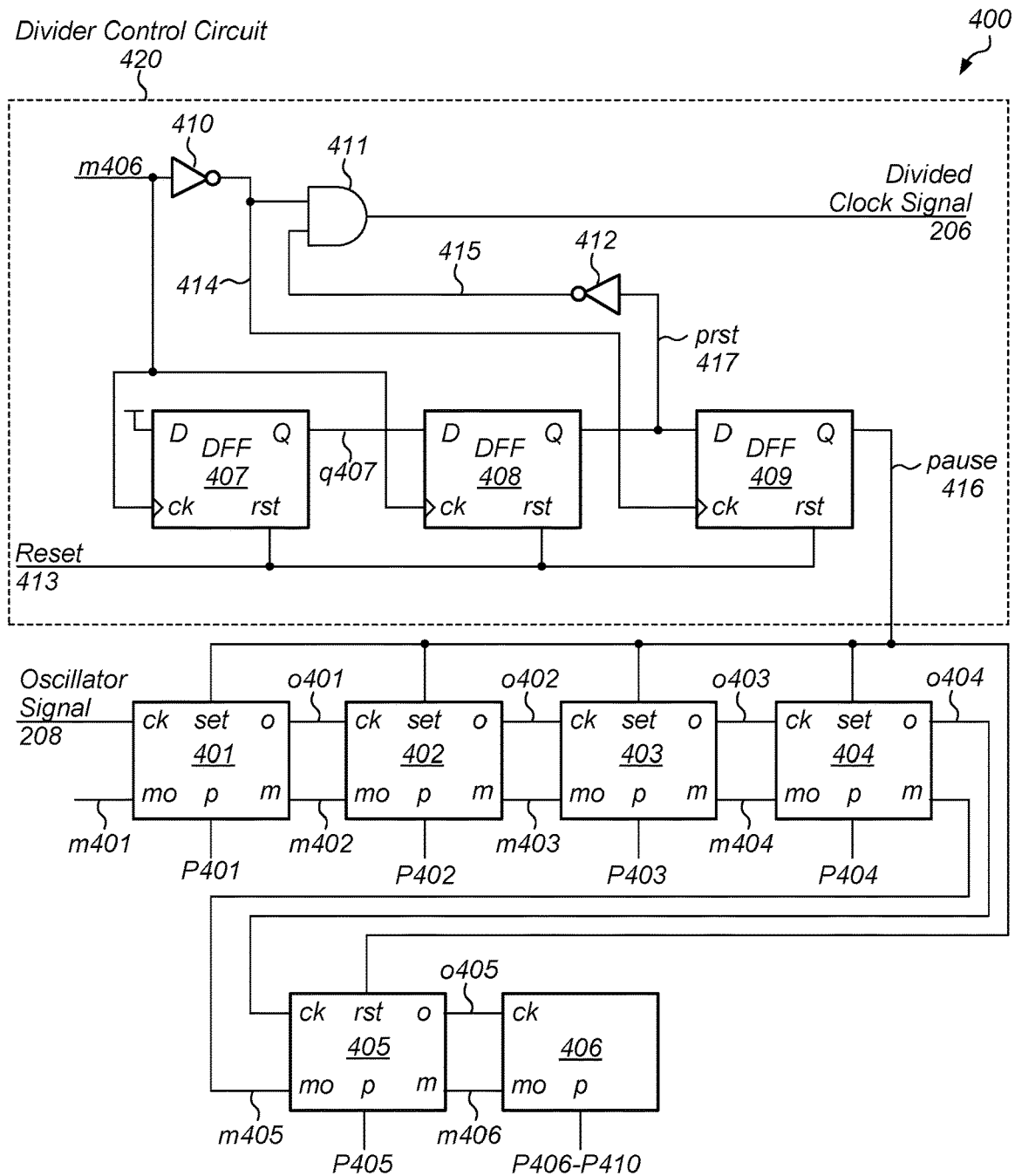
FIG. 4 illustrates a block diagram of another embodiment of a programmable divider circuit.

Another embodiment of a programmable divider chain is depicted in FIG. 4. In various embodiments, programmable divider chain circuit may correspond to programmable divider chain 102 as depicted in FIG. 1 and FIG. 2. As illustrated, programmable divider chain circuit 400 includes divider control circuit 420, divider stages 401-405, and counter circuit 406.

The ck input of divider stage 401 is coupled to oscillator signal 208, and the o output of divider stage 401 is coupled to the ck input of divider stage 402 via node o401. The m input of divider stage 401 is coupled to the mo output of divider stage 402 via node m402. The mo output of divider stage 401 is coupled to node m401. In a similar fashion, the ck input of divider stage 402 is coupled to node o401, and the o output of divider stage 402 is coupled to the ck input of divider stage 403 via node o402. The m input of divider stage 402 is coupled to the mo output of divider stage 403 via node m403, and the mo output of divider stage 402 is coupled to node m402.

The ck input of divider stage 403 is coupled to node o402, and the o output of divider stage 403 is coupled to the ck input of divider stage 404 via node o403. The m input of divider stage 403 is coupled to the mo output of divider stage 404 via node m404. The mo output of divider stage 403 is coupled to node m403. In a similar fashion, the ck input of divider stage 404 is coupled to node o403, and the o output of divider stage 404 is coupled to the ck input of divider stage 405 via node o404. The m input of divider stage 404 is coupled to the mo output of divider stage 405 via node m405. The mo output of divider stage 404 is coupled to node m404.

The ck input of divider stage 405 is coupled to node o404, and the o output of divider stage 405 is coupled to the ck input of counter circuit 406 via node o405. The m input of divider stage 403 is coupled to the mo output of counter circuit 406 via node m406. The mo output of divider stage 405 is coupled to node m405.

Counter circuit 406 may be a particular embodiment of a sequential logic circuit configured to generate a value on node m406 using transitions on node o405. In some cases, the value of counter circuit 406 may be preset using values P406-P410, or the values may be used to change a counting pattern of counter circuit 406.

Each of signals P401-405 is used to adjust a frequency divisor of the divider stages 401-405. In various embodiments, each of divider stages 401-405 can be configured to divide the frequency of its input signal by either 2 or 3 to generate its output signals. By setting different combinations of divider stages 401-405 to different values, the frequency of oscillator signal 208 may be divided by any suitable integer in order to generate divided clock signal 206.

In various embodiments, divider control circuit 420 may correspond to divider control circuit 103. As illustrated, divider control circuit 420 includes DFFs 407-409, inverters 410 and 412, and AND gate 411. It is noted that DFFs 407-409 may be particular embodiments of data flip-flop circuits, and inverters 410 and 412 may be particular embodiments of complementary metal-oxide semiconductor (CMOS) inverting amplifiers. It is also noted that AND gate 411 may be a particular embodiment of a CMOS logic gate configured to perform a logical-AND on its input signals to generate an output signal.

The D input of DFF 407 is coupled to a power supply signal, and its Q output (node 418) is coupled to the D input of DFF 408. The ck input of DFF 407 is coupled to signal m406 (the output of counter circuit 406). The Q output of DFF 408 (prst 417) is coupled to the D input of DFF 409 and the input of inverter 412. The ck input of DFF 408 is also coupled to signal m406. The Q output of DFF 409 is coupled to pause 416, which is, in turn, coupled to the set inputs of divider stages 401-405. The rst inputs of DFFs 407-409 are coupled to reset 413.

The input of inverter 410 is coupled to signal m406 and the output of inverter 410 is coupled to node 414. The output of inverter 412 is coupled to node 415. The inputs of AND gate 411 are coupled nodes 414 and 415, and the output of AND gate 411 is coupled to divided clock signal 206.

During a frequency calibration operation, reset 413 is set low allowing DFFs 407-409 to become active. Transitions of oscillator signal 208 toggle divider stage 401, which, in turn, toggle divider stage 402, and so forth. Once the state of signal m406 transitions from low to high, DFFs 407 and 408 are clocked. When signal m406 transitions back low, DFF 409 is clocked, generating pause 416. When pause 416 is asserted, divider stages 401-405 are held in their set states, preventing further transitions on oscillator signal 208 from triggering transitions within the divider stages 401-405. By halting the divider stages in this fashion, divided clock signal 206 and reference signal 104 may be aligned upon completion of the frequency calibration operation, thereby reducing a time for phase-locked loop circuit 100 to lock.

Figure 5A:
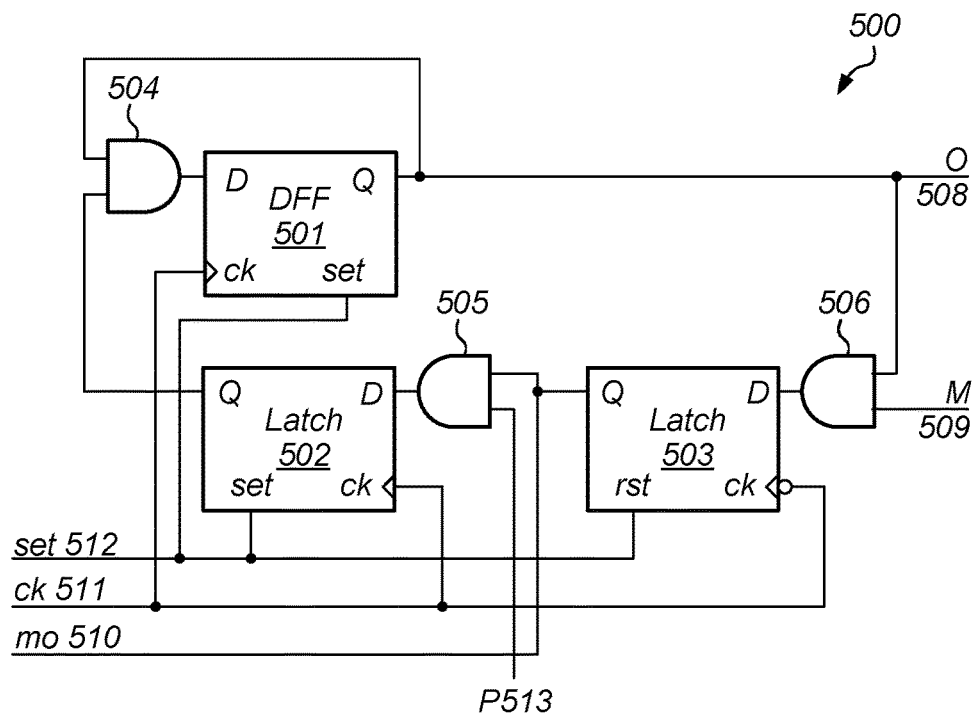
FIG. 5A illustrates a block diagram of an embodiment of a divider stage circuit.

The programmable divider chains depicted in FIG. 3 and FIG. 4 employ multiple divider stages configured to divide a frequency of a input signal to generate an output signal. An embodiment of a divider stage is illustrated in FIG. 5A. As illustrated, divider stage 500 includes data flip-flip (DFF) 501, and latch circuits 502 and 503, and AND gates 504-506, and is configured to generate and output signal (O 508) whose frequency is a quotient of a frequency of an input signal (ck 511) In various embodiments, divider stage 500 may correspond to any of divider stages 301-303, or 401-404, as depicted in FIG. 3 and FIG. 4.

The D input of DFF 501 is coupled to AND gate 504, which combines signal O 508 (which is coupled to the Q output of DFF 501) and the Q output of latch circuit 502. The ck input of DFF 501 is coupled to signal ck 511, and the set input of DFF 501 is coupled to signal set 512. DFF 501 may include two latch circuit coupled in series, and may be configured to sample data at its D input using the first latch circuit and then transfer, based on a value of its set input, the sampled data to the second latch circuit. DFF 501 may also be configured to initialize a value in one of the two latch circuits in response to an assertion of a signal coupled to its set input.

The Q output of latch circuit 502 is coupled to an input of AND gate 504, and the D input of latch circuit 502 is coupled to an output of AND gate 505. As with DFF 501, the set input of latch circuit 502 is coupled to signal set 512 and the ck input of latch circuit 502 is coupled to signal ck 511. Latch circuit 502 is configured to sample and hold a value present at its D input based on a value presents at its ck input. An assertion of a signal coupled to the set input of latch circuit 502 may initialize latch circuit 502 to a particular logic value.

The D input of latch circuit 503 is coupled to an output of AND gate 506, and the Q output of latch circuit 503 is coupled to an input of AND gate 505. The ck input (which is complemented) of latch circuit 503 is coupled to signal ck 511 and the rst input of latch circuit 503 is coupled to signal set 512. Latch circuit 503 is configured to operate in a similar fashion to latch circuit 502, although using an opposite phase of signal ck 511. Also, latch circuit 503 is configured to reset, i.e., initialize the value stored to a logical-0, as opposed to being set to a logical-1 value in response to an assertion of set signal 512.

AND 506 gate is configured to perform a logical-AND operation of signal o508 and M 509. AND gate 505 is configured to perform a logical-AND function using signal p513 and the Q output of latch circuit 503. By adjusting the value of signal p513, the frequency of ck 511 may be divided by either a factor of 2 or 3, to generate signal O 508.

Figure 5B:
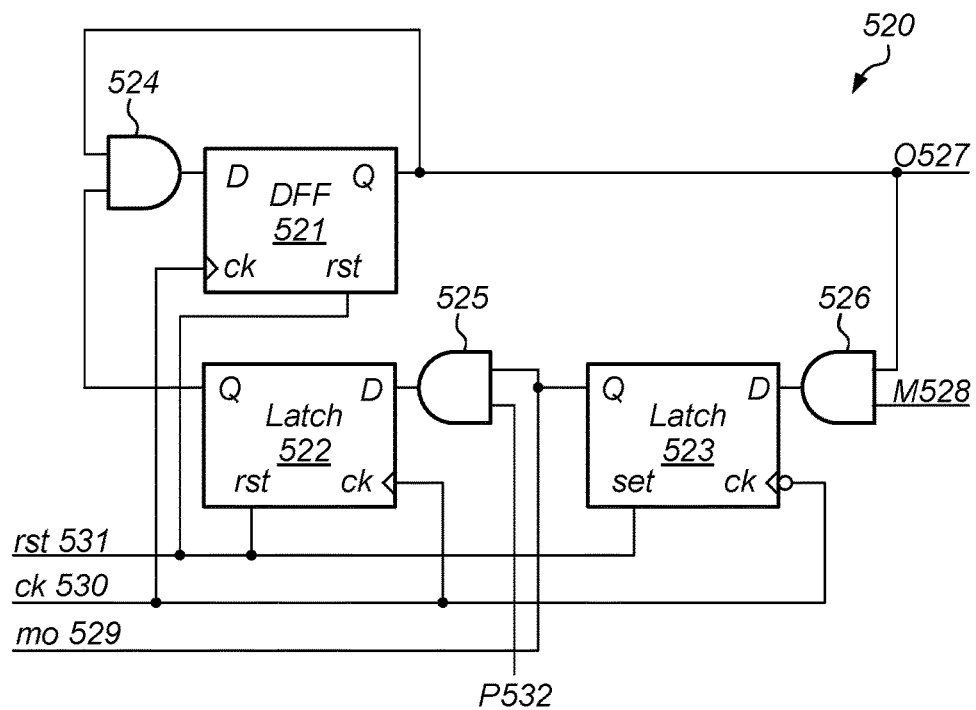
FIG. 5B illustrates a block diagram of another embodiment of a divider stage circuit.

A different embodiment of a divider stage is illustrated in FIG. 5B. As illustrated divider stage 520 includes DFF 521, latch circuits 522 and 523, and AND gates 524-526.

The D input of DFF 521 is coupled to AND gate 524, which combines signal O 527 (which is coupled to the Q output of DFF 521) and the Q output of latch circuit 522. The ck input of DFF 521 is coupled to signal ck 511, and the rst input of DFF 521 is coupled to signal rst 531.

The Q output of latch circuit 522 is coupled to an input of AND gate 524, and the D input of latch circuit 522 is coupled to an output of AND gate 525. As with DFF 521, the set input of latch circuit 522 is coupled to signal rst 531 and the ck input of latch circuit 522 is coupled to signal ck 530.

The D input of latch circuit 523 is coupled to an output of AND gate 526, and the Q output of latch circuit 523 is coupled to an input of AND gate 525. The ck input (which is complemented) of latch circuit 523 is coupled to signal ck 530 and the set input of latch circuit 523 is coupled to signal rst 531.

AND 526 gate is configured to perform a logical-AND operation of signal O 527 and M 528. AND gate 525 is configured to perform a logical-AND function using signal P532 and the Q output of latch circuit 523. By adjusting the value of signal P532, the frequency of ck 530 may be divided by either a factor of 2 or 3, to generate signal O 527.

Divider stage 520 is configured to operate in a similar fashion as divider stage 500 (as described above) with DFF 521 being reset, and latch circuit 523 being set, in response to an assertion of signal rst 531.

It is noted that AND gates 504-506 and 524-526 may be particular embodiments of logic gates configured to generate an output signal by performing a logical-AND operation on its input. In some cases, AND gates 504-506 may include NAND gates and inverter circuits, while in other embodiments, AND gates 504-506 may be constructed as complex logic gates.

As used and described herein, a logical-0, logic 0 value or low logic level, describes a voltage sufficient to activate a p-channel metal-oxide semiconductor field effect transistor (MOSFET), and that a logical-1, logic 1 value, or high logic level describes a voltage level sufficient to activate an n-channel MOSFET. It is noted that, in various other embodiments, any suitable voltage levels for logical-0 and logical-1 may be employed.

Figure 6:
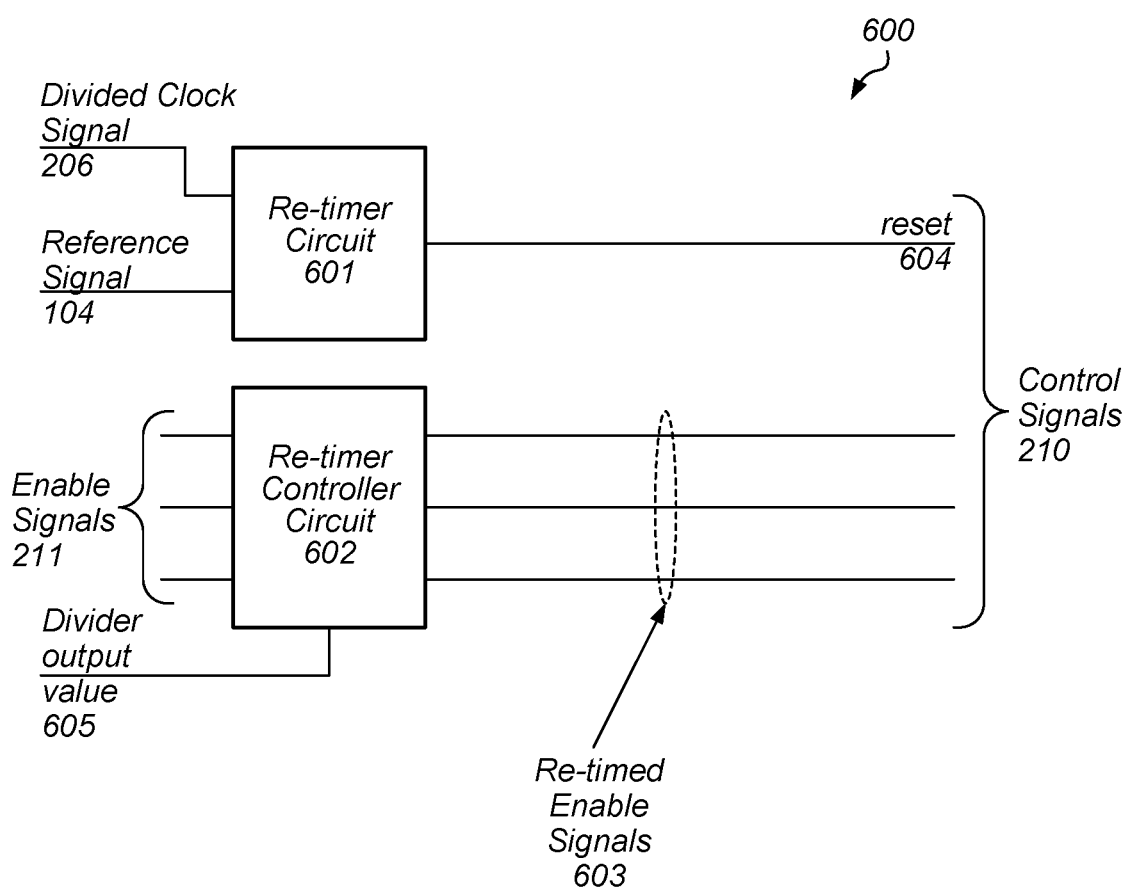
FIG. 6 illustrates a block diagram of a control circuit for a clock generator subsystem.

As described about, during a frequency calibration operation, some of the circuit blocks included in a phase-locked loop are disabled. In order to minimize the lock time of the phase-locked loop upon the completion of the frequency calibration operation, the enable signals for the phase detector circuit, the filter circuit, and the charge pump circuit may be re-timed. A block diagram of a control circuit for re-timing the phase-lock loop enable signals is illustrated in FIG. 6. In various embodiments, control circuit 600 may correspond to sync control circuit 209 as illustrated in FIG.

2. As illustrated, control circuit 600 includes re-timer circuit 601 and re-time controller circuit 602.

Re-timer circuit 601 is configured to generate reset 604 using divided clock signal 206 and reference signal 104. It is noted that reset 604 is part of control signals 210 and may, in some embodiments, correspond to reset 337 or reset 413 as illustrated in FIG. 3 and FIG. 4, respectively. In various embodiments, re-timer circuit 601 is configured to generate reset 604 in response to a determination that a phase difference between divided clock signal 206 and reference signal 104 is substantially zero. As used herein, a zero phase difference references to a condition in which the phase difference between two signals is less than a particular threshold value.

Re-timer controller circuit 602 is configured to generate re-timed enable signals 603, which are included in control signals 210, using enable signals 211, and divider output value 605. In some cases, re-timed enable signals 603 may be delayed versions of enable signals 211. Once re-timer circuit 601 generates reset 604, the programmable divider chain, such as programmable divider chain 102 may resume operation. Re-timer controller circuit 602 may wait to assert re-timed enable signals 603 until divider output value 605 transitions from its paused state. At that point, re-timer controller circuit 602 may assert re-timed enable signals 603 to activate phase detector circuit 201, charge pump circuit 202, and filter circuit 203, allowing phase-locked loop circuit 220 to resume operation.

In various embodiments, re-timer circuit 601 and re-timer controller circuit 602 may be particular embodiments of sequential logic circuits or state machines. Alternatively, re-timer circuit 601 and re-timer controller circuit 602 may be implemented as general-purpose processors configured to execute program instructions to before the aforementioned re-timing operations.

Figure 7:
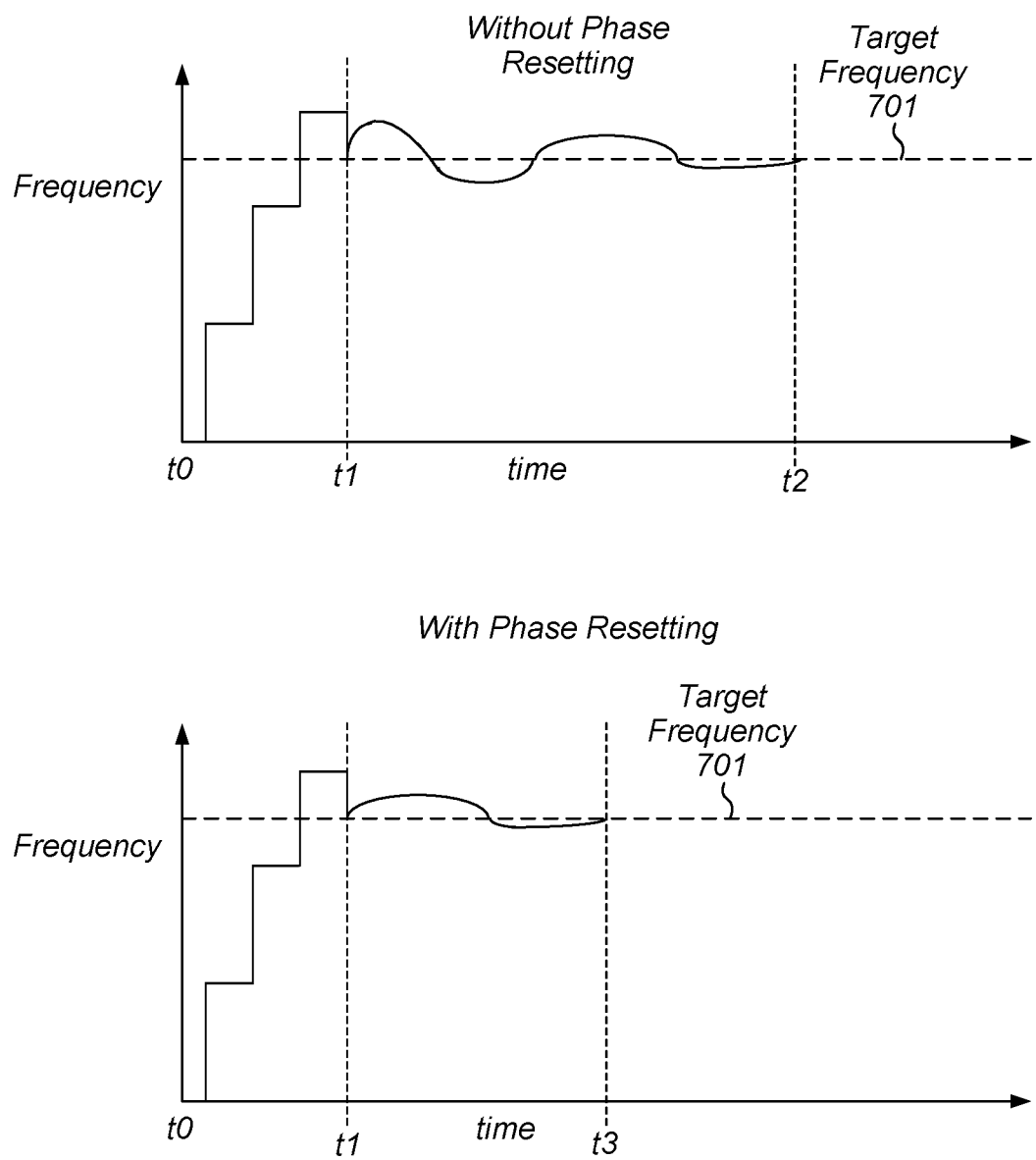
FIG. 7 illustrates sample waveforms depicting phase locking with and without phase resetting.

Turning to FIG. 7, sample waveforms of clock signal 105 illustrating phase locking with and without phase resetting are depicted. As illustrated, from time t0 to time t1, a frequency calibration operation is performed on a phase-locked loop such as phase-locked loop circuit 101. As described above, during the frequency calibration, the frequency of clock signal 105 is coarsely adjusted to a value near target frequency 701. At time t1, the frequency calibration operation is completed, and phase locking divided clock signal 206 to reference signal 104 may begin.

In the case where no phase resetting is used, phase-locked loop circuit 101 locks at time t2. If, however, phase resetting is applied, as described above and in regard to FIG. 9 below, the time to achieve phase lock is reduced. As illustrated in example waveforms of FIG. 7, when phase resetting is applied, phase-locked loop circuit 101 locks at time t3, which occurs earlier than time t2.

The reduction in lock time is a result of the elimination of unwanted pulses on divided clock signal 206. When phase lock resetting is not applied, multiple clock cycles may be required for clock signal 105 to propagate through programmable divider chain circuit 102. During such clock cycles, different values may be propagated through the divider stages included in programmable divider chain circuit resulting in undesirable transitions on divided clock signal 206. Such undesirable transitions may result in phase detector circuit 201 instructing charge pump circuit 202 to adjust the voltage level of oscillator circuit 204, moving the frequency of clock signal 105 away from target frequency 701. Recovering from such an excursion in frequency may result in phase-locked loop circuit 101 taking longer to achieve phase lock.

When phase resetting is applied, phase detector circuit 201, charge pump circuit 202, and filter circuit 203 are disabled for a period of time after the frequency calibration operation has completed. During that period of time, clock signal 105 may propagate through programmable divider chain circuit 102 and phase detector circuit 201 ignores any undesirable transitions since it is disabled. As a result, the frequency of clock signal 105 remains close to a value set after the frequency calibration operation. Once phase detector circuit 201, charge pump circuit 202, and filter circuit 203 are re-enabled, there are no longer undesirable transitions occurring on divided clock signal 206, so the phase-locked loop circuit 101 can more quickly lock to the target frequency.

Figure 8:
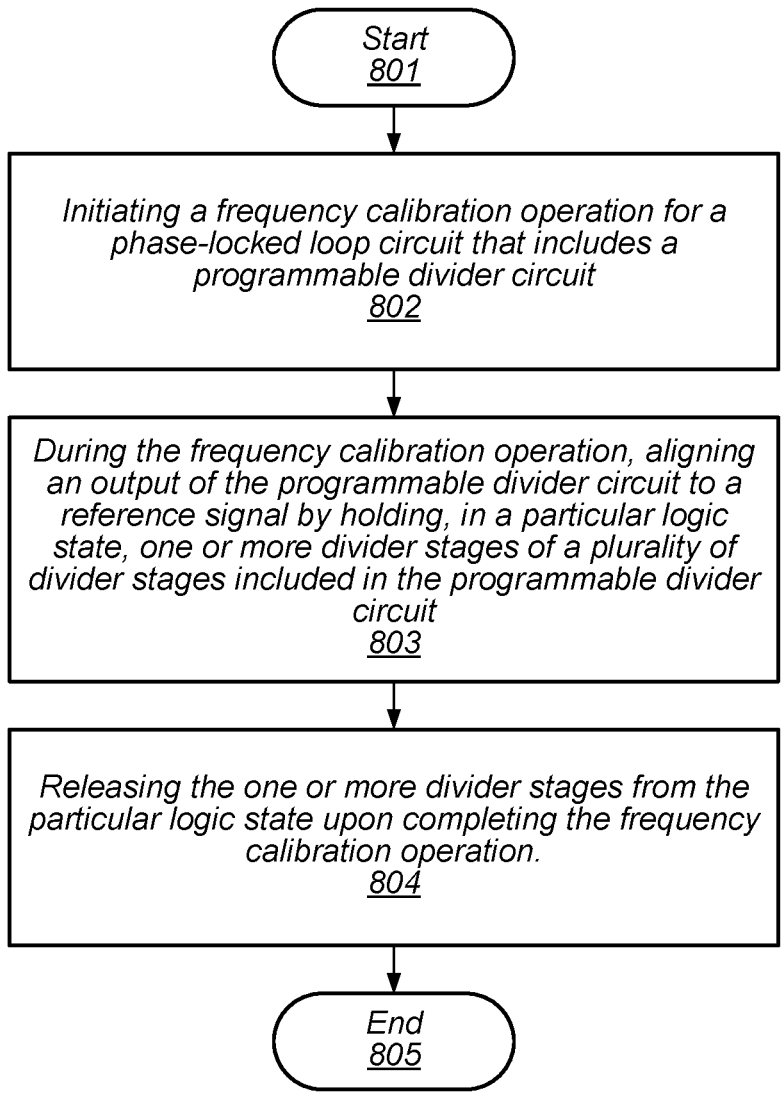
FIG. 8 illustrates a flow diagram depicting an embodiment of a method for operating phase-locked loop.

Turning to FIG. 8, a flow diagram depicting an embodiment of a method for operating clock generator subsystem is illustrated. The method, which may be applied to various clock generator subsystems, e.g., clock generator subsystem 200, begins in block 801.

The method includes initiating a frequency calibration operation for a phase-locked loop circuit that includes a programmable divider circuit (block 802). In some cases, the frequency calibration operation may be initiated after a power-on or other reset event, a change in a target frequency for an output signal of the phase-locked loop, or any other suitable event. During the frequency calibration operation, a feedback loop of the phase-locked loop circuit may be opened. By opening the feedback loop of the phase-locked loop circuit, the oscillator may be reset to a frequency close the desired lock frequency, thereby reducing an amount of time necessary for the phase-locked loop to lock to the desired frequency upon completion of the frequency calibration operation.

In various embodiments, the phase-locked loop circuit includes a phase detector circuit, a charge pump circuit, and a filter circuit included in the phase-locked loop circuit. In such cases, opening the feedback loop includes disabling the phase detector circuit, the charge pump circuit, and the filter circuit. The method may also include, upon completion of the frequency calibration operation, enabling the phase detector circuit, the charge pump circuit, and the filter circuit based on a phase relation between a reference signal and an output signal of the programmable divider circuit.

The method further includes during the frequency calibration operation, aligning an output of the programmable divider circuit to a reference signal by holding, in a particular logic state, one or more divider stages of a plurality divider stages included in the programmable divider circuit (block 803).

In some embodiments, the method may further include generating a pause signal, in response to determining that one or more divider stages have reached a particular logic state during the frequency calibration operation. The method may also include holding the particular logic state of the one or more divider stages using the pause signal.

The method also includes releasing the one or more divider stages from the particular logic state upon completing the frequency calibration operation (block 804). Upon releasing the one or more divider stages, the programmable divider chain may proceed from the particular logic state. By holding at least part of the programmable divider chain in the particular logic state, the number of cycles before the clock signal is ready to use is reduced, thereby reducing the time to achieve phase lock. The method concludes in block 805.

As described above, a clock generator subsystem may employ phase resetting upon completion of a frequency calibration operation. Another embodiment of a method for operating a clock generator subsystem using phase resetting is illustrated in the flow diagram of FIG. 9. Like the flow diagram of FIG. 8, the method depicted in the flow diagram of FIG. 9, which begins in block 901, may be applied various clock generator subsystems, including clock generator subsystem 200.

The method includes initiating a frequency calibration operation for a phase-locked loop circuit that includes a programmable divider circuit (block 902). In some cases, the frequency calibration operation may be initiated after a power-on or other reset event, a change in a target frequency for an output signal of the phase-locked loop, or any other suitable event.

The method further includes, in response to initiating the frequency calibration operation, disabling a phase detector circuit, a charge pump circuit, and a filter circuit included in the phase-locked loop circuit (block 903). As described above, each of the phase detector circuit, the charge pump circuit, and the filter circuit may be enabled by separate control signals.

Upon completion of the frequency calibration operation, the method also includes comparing a phase of reference signal to a phase of an output of the programmable divider circuit (block 904). In various embodiments, a second different phase detector circuit may be employed.

The method further includes, in response to determining a particular phase relationship exists between the reference signal and the output of the programmable divider circuit, enabling the phase detector circuit, the charge pump circuit, and the filter circuit (block 905). By delaying enabling the phase detector circuit, the charge pump circuit, and the filter circuit until the particular phase relationship exits, a time for the phase-locked loop to lock to a target frequency upon completion of the frequency calibration operation may be reduced. The method concludes in block 906.

Figure 9:
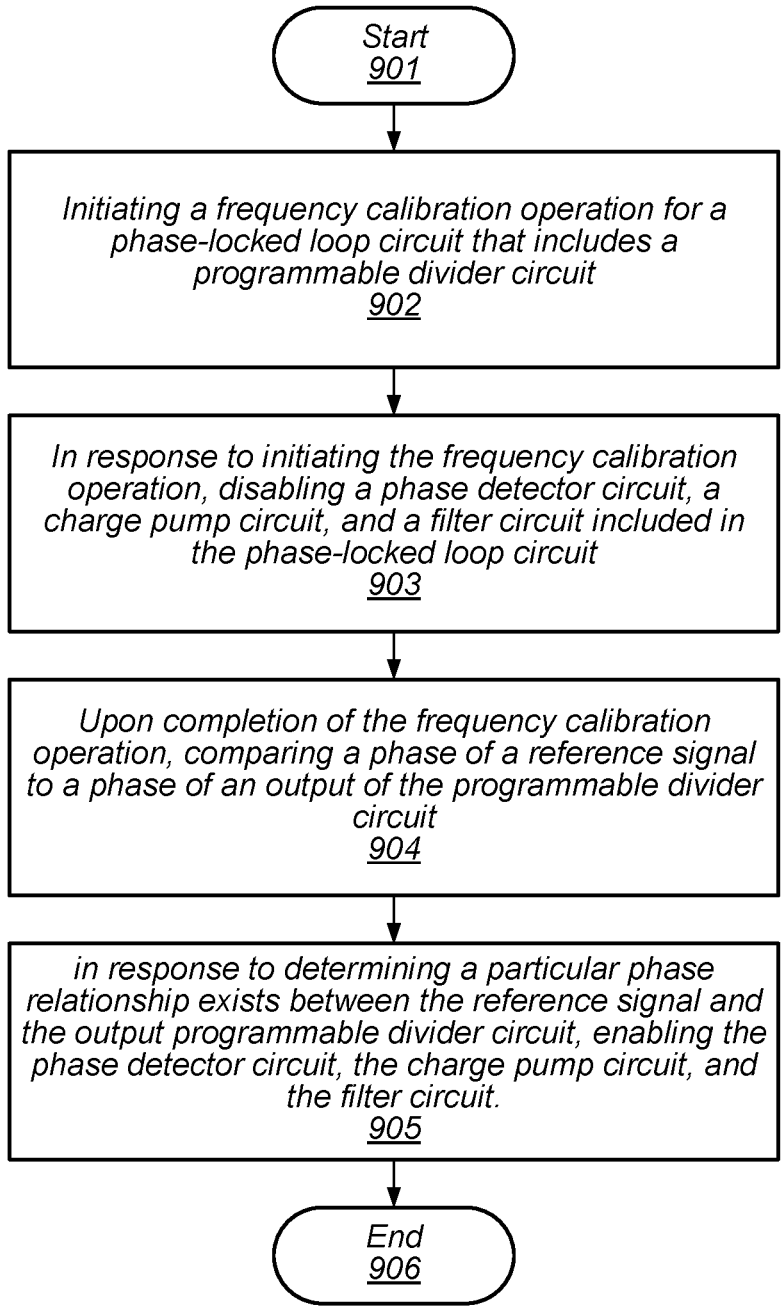
FIG. 9 illustrates a flow diagram depicting an embodiment of another method for operating a phase-locked loop.

It is noted that the method depicted in the flow diagram of FIG. 9 may be applied separately or in combination with the method depicted in the flow diagram of FIG. 8.

Figure 10:
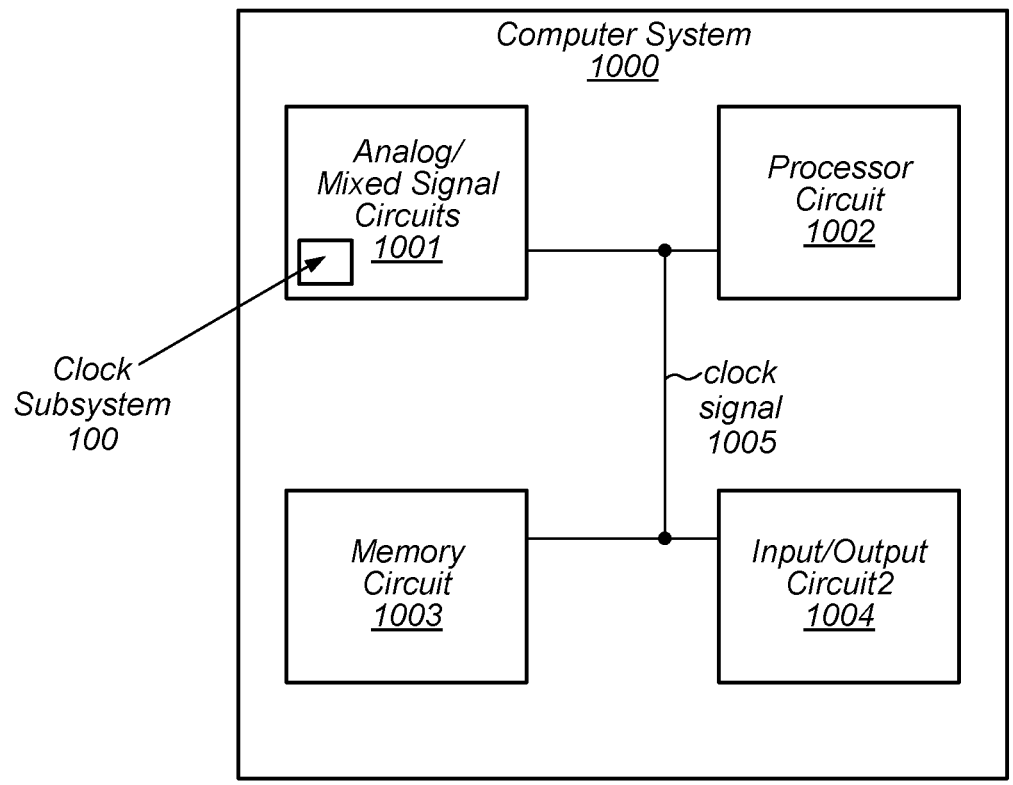
FIG. 10 is a block diagram of one embodiment of a computer system that includes a clock generator subsystem.

A block diagram of computer system is illustrated in FIG. 10. In the illustrated embodiment, the computer system 1000 includes analog/mixed signal circuits 1001, processor circuit 1002, memory circuit 1003, and input/output circuits 1004, each of which is coupled to clock signal 1005. In various embodiments, computer system 1000 may be a system-on-a-chip (SoC) and/or be configured for use in a desktop computer, server, or in a mobile computing application such as, e.g., a tablet, laptop computer, or wearable computing device.

Analog/mixed signal circuits 1001 includes clock generator subsystem 200, which is configured to generate clock signal 1005 in order to provide a timing reference for processor circuit 1002, memory circuit 1003, and input/output circuits 1004. Although analog/mixed signal circuits 1001 is depicted as including a clock generator subsystem, in other embodiments, any suitable number of clock generator subsystems may be included in analog/mixed signal circuits 1001, each configured to generate a respective one of multiple clock signals included in computer system 1000.

Processor circuit 1002 may, in various embodiments, be representative of a general-purpose processor that performs computational operations. For example, processor circuit 1002 may be a central processing unit (CPU) such as a microprocessor, a microcontroller, an application-specific integrated circuit (ASIC), or a field-programmable gate array (FPGA).

Memory circuit 1003 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 10, in other embodiments, any suitable number of memory circuits may be employed.

Input/output circuits 1004 may be configured to coordinate data transfer between computer system 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1004 may be configured to implement a version of Universal Serial Bus (USB) protocol or IEEE 1394 (Firewire®) protocol.

Input/output circuits 1004 may also be configured to coordinate data transfer between computer system 1000 and one or more devices (e.g., other computing systems or integrated circuits) coupled to computer system 1000 via a network. In one embodiment, input/output circuits 1004 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1004 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a phase-locked loop circuit including a programmable divider circuit that includes a plurality of divider stages, wherein the phase-locked loop circuit is configured to generate a clock signal using a reference signal; and
 a divider control circuit that includes a plurality of flip-flop circuits, wherein the divider control circuit is configured, in response to an initiation of a frequency calibration operation being performed on the phase-locked loop circuit, to:

generate a timing signal using respective output signals of at least two divider stages of the plurality of divider stages, wherein the timing signal is generated in response to a determination that one or more of the plurality of divider stages have reached a particular logic state during the frequency calibration operation; and toggle, using the timing signal, at least one of the plurality of flip-flop circuits to generate a pause signal; and wherein the programmable divider circuit is configured to hold the particular logic state of the one or more of the plurality of divider stages using the pause signal.

2. The apparatus of claim 1, wherein the phase-locked loop circuit further includes an oscillator circuit, a phase detector circuit, a charge pump circuit, and a filter circuit, and wherein the divider control circuit is further configured, in response to the initiation of the frequency calibration operation, to disable the phase detector circuit, the charge pump circuit, and the filter circuit.

3. The apparatus of claim 2, wherein the divider control circuit is further configured to:
in response to completion of the frequency calibration operation and in response to a detection of a particular phase relationship between the reference signal and an output programmable divider circuit, enable the phase detector circuit.

4. The apparatus of claim 3, wherein the divider control circuit is further configured to, enable the charge pump circuit and the filter circuit, in response to the detection that the particular phase relationship.

5. The apparatus of claim 1, wherein a particular divider stage of the plurality of divider stages is configured to selectively divide, based on a program data bit, a frequency of an input signal.

6. A method, comprising:
initiating a frequency calibration operation for a phase-locked loop circuit that includes a programmable divider circuit comprising a plurality of divider stages;
in response to initiating the frequency calibration operation:
generating, by a divider control circuit comprising a plurality of flip-flop circuits, a timing signal based on respective output signals of at least two divider stages of the plurality of divider stages, wherein the timing signal is generated in response to determining that one or more divider stages of the plurality of divider stages have reached a particular logic state; and
toggling at least one of the plurality of flip-flop circuits using the timing signal to generate a pause signal;
maintaining the particular logic state by holding the one or more divider stages using the pause signal; and
releasing the one or more divider stages from the particular logic state upon completing the frequency calibration operation.

7. The method of claim 6, further comprising in response to initiating the frequency calibration operation, opening a feedback loop of the phase-locked loop circuit.

8. The method of claim 7, wherein the phase-locked loop circuit includes a phase detector circuit, a charge pump circuit, and a filter circuit included in the phase-locked loop circuit, and wherein opening the feedback loop includes disabling the phase detector circuit, the charge pump circuit, and the filter circuit.

9. The method of claim 8, further comprising, upon completion of the frequency calibration operation, enabling the phase detector circuit, the charge pump circuit, and the filter circuit based on a phase relationship between a reference signal and an output signal of the programmable divider circuit.

10. The method of claim 6, further comprising disabling the pause signal in response to receiving a reset signal.

11. The method of claim 6, further comprising setting respective control signals for the one or divider stages to change a divisor of the programmable divider circuit.

12. An apparatus, comprising:
an oscillator circuit configured to generate an oscillator signal, wherein a frequency of the oscillator signal is based on a voltage level of a control signal;
a programmable divider circuit including a plurality of divider stages, wherein the programmable divider circuit is configured to generate a divided signal using the oscillator signal, wherein a frequency of the divided signal is less than the frequency of the oscillator signal, wherein a given one of the plurality of divider stages is configured to change a frequency divisor in response to a control signal;
a phase detector circuit configured to compare a reference signal and the divided signal;
a charge pump circuit configured to modify, based on a result of a comparison of the reference signal and the divided signal, the voltage level of the control signal;
a control circuit configured to:
during a frequency calibration operation:
deactivate the programmable divider circuit, the phase detector circuit, and the charge pump circuit; and
hold one or more divider stages of the plurality of divider stages in a particular logic state; and
in response to a completion of the frequency calibration operation, reactivate the programmable divider circuit, phase detector circuit, and the charge pump circuit based on a comparison of respective phases of the reference signal and the divided signal.

13. The apparatus of claim 12, wherein to hold the one or more divider stages of the plurality of divider stages in the particular logic state, the control circuit is further configured to generate a timing signal using respective output signals of at least two divider stages of the plurality of divider stages.

14. The apparatus of claim 13, wherein the control circuit is further configured to generate a delayed version of the timing signal by toggling at least one flip-flop circuit using the timing signal.

15. The apparatus of claim 12, wherein the programmable divider circuit is further configured to generate a clock signal using the oscillator signal, wherein a different frequency of the clock signal is less than the frequency of the oscillator signal and different than the frequency of the divided signal.

16. The apparatus of claim 12, wherein the control circuit is further configured, during the frequency calibration operation, adjust the frequency of the oscillator signal by adjusting operation of the oscillator circuit.

* * * * *